United States Patent [19]

Wurczinger

[11] Patent Number: 4,981,566
[45] Date of Patent: Jan. 1, 1991

[54] ARRANGEMENT FOR MEASURING THE THICKNESS OF THIN LAYERS

[75] Inventor: Hans-Dieter Wurczinger, Bad Vilbel, Fed. Rep. of Germany

[73] Assignee: Leybold Aktiengesellschaft, Hanau, Fed. Rep. of Germany

[21] Appl. No.: 423,965

[22] Filed: Oct. 19, 1989

[30] Foreign Application Priority Data

Aug. 2, 1989 [DE] Fed. Rep. of Germany ....... 3925536

[51] Int. Cl.$^5$ ............................................ C23C 14/52
[52] U.S. Cl. ........................... 204/192.13; 204/298.08; 204/298.03; 204/298.23; 204/298.26; 427/9; 118/712; 118/718; 118/721
[58] Field of Search ...................... 204/192.13, 298.03, 204/298.23, 298.24, 298.25, 298.26; 427/9; 118/712, 718–721

[56] References Cited

U.S. PATENT DOCUMENTS 3,661,760 5/1972 Borgne et al. ................... 204/298.03
4,676,883 6/1987 Nelson et al. ................... 204/298.03
4,858,556 8/1989 Siebert ................... 118/664

*Primary Examiner*—Aaron Weisstuch
*Attorney, Agent, or Firm*—Felfe & Lynch

[57] ABSTRACT

A process chamber 27 is provided with several successive cathode arrangements 7, 8 which have targets to be sputtered, wherein diaphragms 39, 40 are held between the respective targets 3, 4 and the path of the workpieces 1, 2. In addition to their center openings 66, 67 for the passage of the flow of coating material, further window-like apertures 68, 69 in the area of the material flow, respectively, which are disposed offset to one another and transversely to the conveying direction F of the substrates and thus produce test strips 70, 71 on the workpieces or special test substrates which are passed by the cathode arrangements 7, 8. The test strips each correspond to one single layer of a layer package 72, produced on the substrate, whereby thickness of each layer may be measured by acquiring data on the transmission, reflection, or resistance properties, or by mechanically measuring each layer.

5 Claims, 2 Drawing Sheets

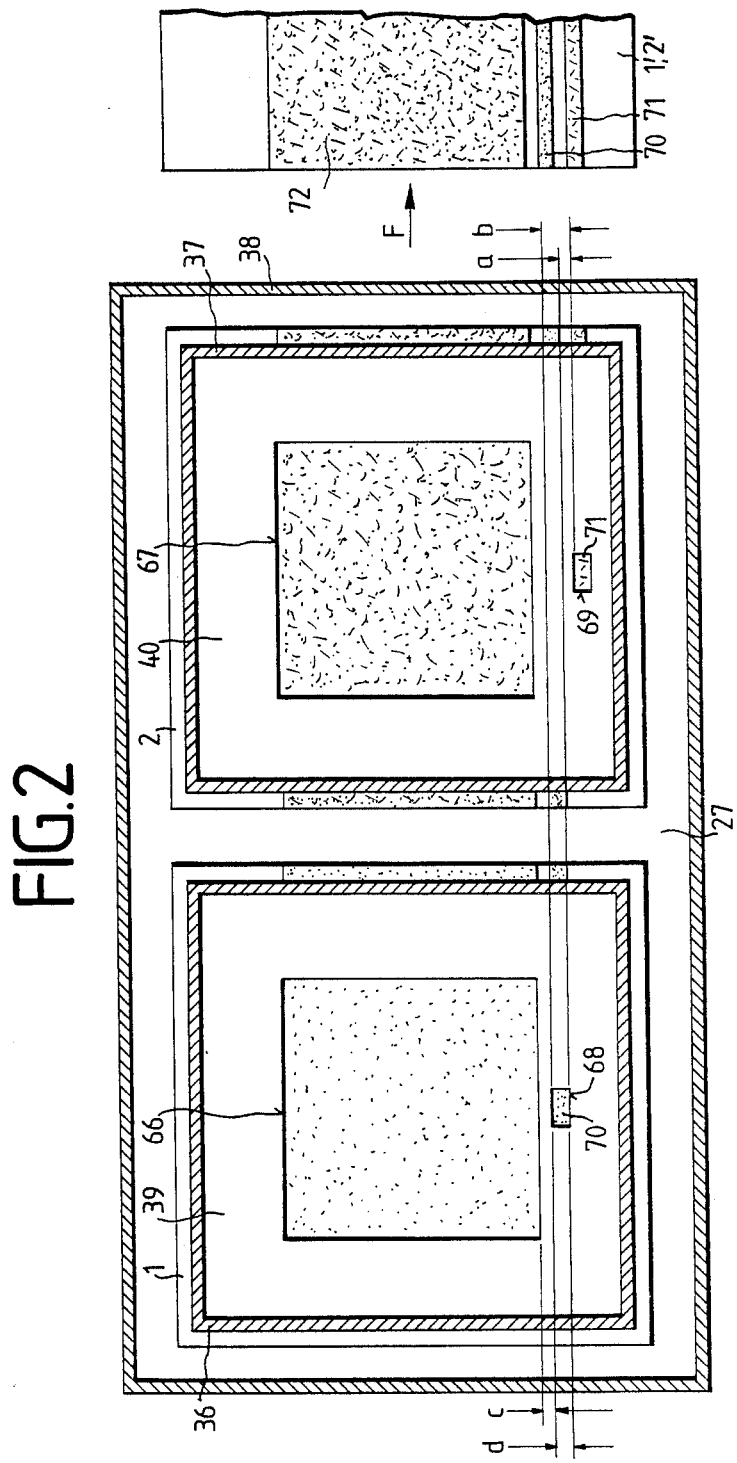

ARRANGEMENT FOR MEASURING THE THICKNESS OF THIN LAYERS

BACKGROUND OF THE INVENTION

The invention relates to an arrangement for measuring the thickness of thin layers which can be applied on workpieces or substrates during the coating of the latter while being conveyed through the process chamber. The thickness measuring is carried out by detecting transmission, reflection or resistance properties or by mechanically measuring the thin layer.

A test glass support for the optic measurement of layer properties is known (German patent No. 29 32 483) having several indentations for test glasses which are equidistantly arranged in a circle on a plate. A drive shaft serves to move the glasses, one at a time, in a transfer movement into the flow of coating material and into the beam of a measuring light; each of the test glasses is associated with a certain coating material so as to always provide the same coating material to be intermittently deposited on the same test glass. This test glass support is used for vacuum coating systems having a carousel which can rotate around a central axis and includes at least one substrate holder which in turn can be exposed to different coating materials in different positions. In order to accomplish the object of rotating or transferring the test glasses during a period of rotation or transferring of the substrate holder into a new coating position, the invention suggests providing the drive shaft of the plate for the test glasses with a first driving wheel which is coupled with a second driving wheel which in turn is concentric with respect to the center axis; the transmission ratio is selected such that whenever the substrate holder is moved into a different position, a different test glass is transferred into the flow of coating material and into the measuring light beam. The test glass support is necessarily coupled with the carousel of the substrate holder such that a wrong correlation is avoided.

SUMMARY OF THE INVENTION

It is an object of the present invention to provide an arrangement for measuring the thickness of thin layers which permits continuously monitoring the individual layers in a coating process wherein the individual workpieces or substrates, for example, are continuously conveyed through the coating chamber and pass by several coating sources or stations.

This object is achieved by providing the process chamber with several successive cathode arrangements which hold the targets to be sputtered; diaphragms are supported between the targets and the workpieces which, in addition to their center passages for the coating materials, each have one further window-like aperture disposed in the area of the material flow transversely to the substrate conveyer and offset with respect to each other. Side-by-side test strips are thus produced on the workpieces or the special test substrates which pass by the cathode arrangement; they each correspond to a respective layer, of a package of layers applied on the substrate or workpiece.

The window-like aperture which is provided on the margin of the diaphragm of the first cathode arrangement is preferably offset by a small degree transversely to the conveying direction of the substrate as compared to the window-like aperture of the diaphragm of the second cathode arrangement. The aperture in the diaphragm of the first cathode arrangement is provided directly at the inside edge of the center opening which is formed by the diaphragm.

Advantageously, a multiple of cathode arrangements is provided in one or several successive process chambers; each cathode arrangement is associated with a diaphragm which has a window-like aperture, and all apertures are disposed offset to one another and transversely to the conveying direction of the substrates. During the production of the layer package, each aperture produces its own test strip either on the workpiece itself or on a special test substrate which is disposed adjacent to this workpiece.

In a preferred embodiment, the window-like aperture and, hence, the test strips are on one side of the workpiece or substrate; it is of course also possible to provide a part of the apertures on the opposing side of the diaphragms of the coating stations and cathode arrangements.

BRIEF DESCRIPTION OF THE DRAWINGS

FIG. 2 is a section along the lines A-B of FIG. 1 and showing the diaphragms of the two cathode arrangements.

DETAILED DESCRIPTION OF THE PREFERRED EMBODIMENT

Figure 1:
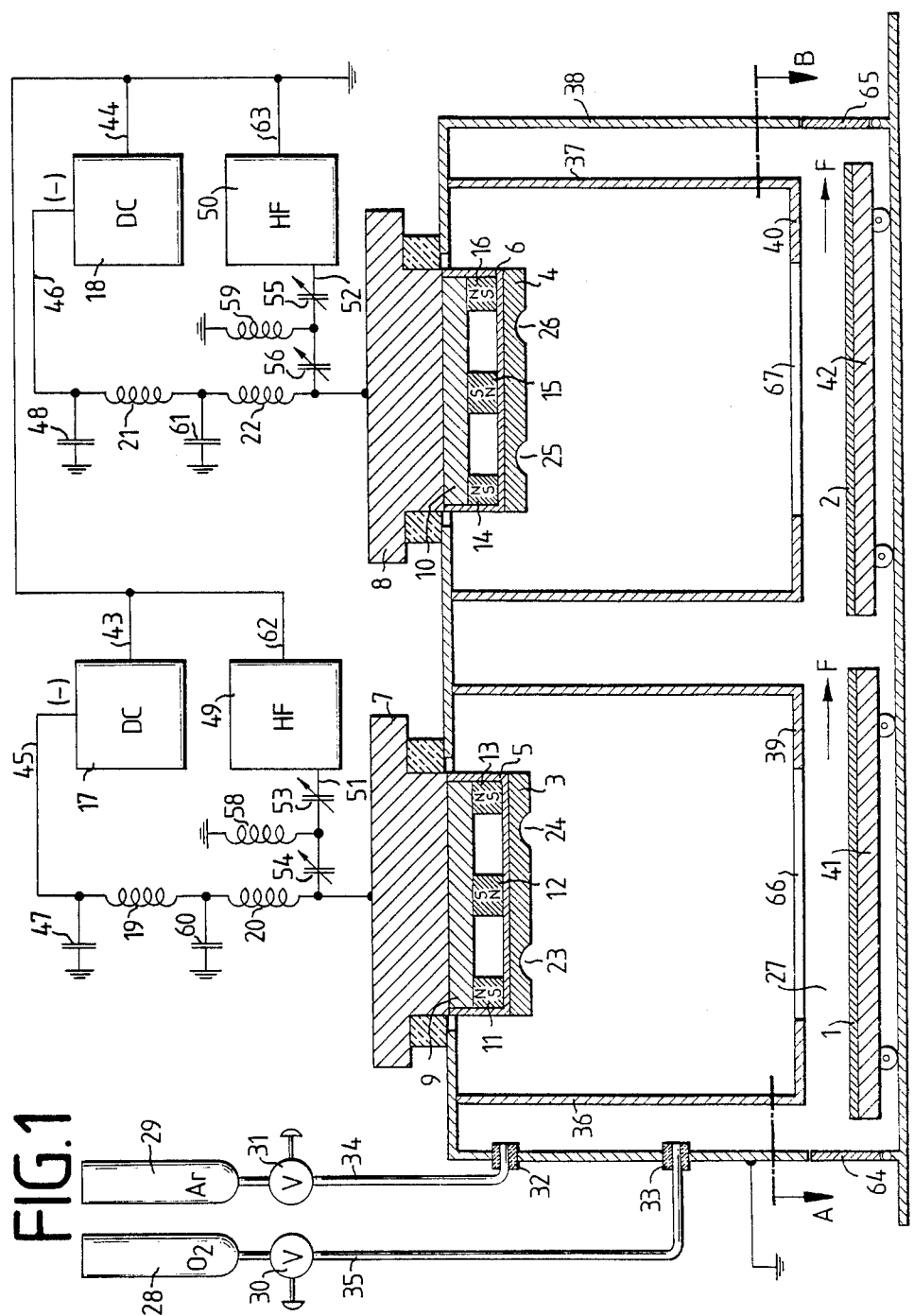
FIG. 1 is a schematic side section of two consecutive coating stations in a coating chamber having sluiceways for passing substrate supports therethrough.

FIG. 1 shows substrates 1, 2 which are disposed on substrate holders 41, 42 which can be moved on rollers and are to be provided with thin layers. The targets 3, 4 to be sputtered are disposed opposite these substrates 1, 2. These targets 3, 4 are connected to electrodes 7, 8 via elements 5, 6 which have a U-shaped cross section; the electrodes each rest on a yoke 9, 10. These yokes and the elements 5, 6 enclose three permanent magnets 11, 12, 13 and 14, 15, 16, respectively. The polarities of the poles of the three permanent magnets which are directed toward each target 3, 4 alternate such that together with the north pole of the center permanent magnet 12 and 15, the south poles of the two outer permanent magnets 11, 13 and 14, 16 form approximately circular arc-like magnetic fields across each target 3, 4. These magnetic fields condense the plasma before the targets 3, 4 such that the greatest density occurs where the maximum of the circular arc of the magnetic field is. The ions in the plasma are accelerated by an electric field which is generated by a direct voltages of direct voltage sources 17, 18. The negative poles of direct voltage sources 17, 18 are connected via two inductors 19, 20 and 21, 22 respectively, to the electrodes 7 and 8, respectively. The electric fields vertically intersect the surfaces of the targets 3 and 4 and accelerates the positive ions of the plasma toward the targets. A more or less large number of atoms or particles is thus ejected from the targets 3 and 4, in particular from the areas 23, 24 and 25, 26 where the maxima of the magnetic fields are. The sputtered atoms or particles travel in the direction toward the workpieces or substrates 1 and 2 where they are deposited as thin layers.

In the case where the target material is a metal and an oxide layer is to be deposited on the surface, the particles which were ejected from the targets 3, 4 react in a chamber 27 with certain gases which are supplied to this chamber by means of gas feed lines 34, 35 from gas cylinders 28, 29 via valves and inlets 32, 33. This chamber is bounded by three containers 36, 37, 38 of which the one container 38 also encloses the substrates 1, 2 whereas the two other containers 36, 37 terminate in front of the substrates 1, 2 and form two diaphragms 39, 40. Both containers 36, 37 and, hence, the substrates 1, 2 which rest on the substrate holders 41, 42 are electrically connected to ground. Also connected to ground are the terminals 43, 44 of the direct voltage sources 17, 18, the first terminals 45, 46 of which are connected to the inductors 19, 21 and 20, 22 and additionally to capacitors which are in turn connected to ground.

In addition to the direct current sources 17, 18, there are also two high-frequency sources 49 50 having terminals 51, 52 which are electrically connected to the electrodes 7, 8 via two controllable capacitors 53, 54 and 55, 56 between which an inductor 58, 59 is connected which in turn is connected to ground. The connecting point of the two other inductors 19, 20 and 21, 22 is connected to a capacitor 60, 61, respectively, which in turn is connected to ground as are the second terminals 62, 63 of the high-frequency sources 49, 50.

The capacitors 47, 60 and 48, 61 as well as the enclosed inductors 19, 21 form low pass filter which prevent high frequencies from passing through. The inductors 20, 22 further support this effect. The capacitors 53, 54 and 55, 56 as well as the inductors 58, 59 form a matching unit for the high-frequency supply to the cathodes 7, 8. At the same time, they function as a high pass filter, i.e. the direct current cannot reach the alternating current sources 49, 50.

The gas is supplied to the interspace between the first container 38 and the second containers 36, 37; however, it could also be directly supplied to the second gas containers 36, 37 via a gas distributing system which surrounds the cathodes 7, 8.

In the represented arrangement, a process computer can be included for processing data and releasing control commands. The values of the measured partial pressure in the process chamber 27, for example, can be supplied to this process computer. Based on this and other data, the computer can control the gas flow via valves 30, 31 and adjust the combination of direct and alternating voltage at the cathodes 7, 8. The process computer can also control all other variables, for example, cathode current, high-frequency capacity and magnetic field strength. Since process computers of this kind are known, a description of their design can be omitted.

There are no details given as to how the high frequency supply is internally controlled. However, it is known to establish a control circuit such that a certain desired value is prescribed and the power released is controlled so as to constantly match this value.

In the arrangement of FIG. 1 for coating substrates 1, 2 including two direct current sources 17, 18 and two additional alternating current sources 49, 50, the output voltages of which are superimposed on the direct current sources 17, 18, the electric power of the alternating current sources 49, 50 which is supplied to the electrodes is measured such that it corresponds to 5% to 25% of the power supplied to the electrodes 7, 8 by the direct current sources 17, 18. Instead of an arrangement which includes direct current and alternating current sources, it is also possible to provide exclusively either a direct current or an alternating current source since the configuration thereof is independent with respect to the arrangement in accordance with the invention for measuring the thickness of the sputtered layers. It is also possible to provide more than only two coating sources at which substrates can be passed by in order to be coated.

As seen in FIG. 2, the two diaphragms 39, 40 not only form center openings 66, 67, but are also provided with small window-like apertures 68, 69 which, however, are offset from one another by a distance "a" and both of which have the width "d"; the first aperture 68 is disposed so as to be distant from the inside edge of the center opening 66 by a distance "c". In FIG. 2, distance "b" equals the sum of distance "a" plus distance "d".

During the coating process, the substrates 1, 2 enter the process chamber 27 via a sluiceway 64, then in the direction of arrow F they pass below the two coating sources or cathode arrangements 7, 8 and then exit the coating chamber 27 via sluiceway 65; the substrates are advantageously supported on carriers 41, 42 which are provided with rollers.

Since a partial beam of the material to be sputtered by each of the targets 3, 4 also emerges through the window-like apertures 68, 69 toward the bottom or passes through the latter during the sputtering process, there are two side-by-side strip-like coatings 70, 71 on the substrates 1, 2 once the coating process is finished. One of these coating strips 70 corresponds to the first thin layer in the vicinity of the center opening 66 and the other coating strip 71 corresponds to the second thin layer in the vicinity of the center opening 67 (whereas the layers on the workpiece 1 or 2 are on top of each other, the test strips are side-by-side such that both layers can be evaluated and measured. It is clear that for generating a test strip, i.e. the layers produced in the diaphragms 39, 40 via the window-like apertures 68, 69, special test substrates can be provided on the substrate holders 41, 42 next to the workpieces. In the arrangement of the drawing each test substrate has two test strips after passing through the process chamber 27 whereas the adjacent workpiece itself has a two-layer package.

As seen in FIG. 1 and FIG. 2 a substrate 1' and 2' provided with a layer package 72 has left the coating chamber 27 through sluiceway 65 in direction F and was provided via the first window-like aperture 68 with a test strip 70 and via the second window-like aperture 69 with a test strip 71. Both test strips can be individually checked whereby the quality of the layer package 72 is concluded from the properties of the strips.

I claim:

1. Arrangement for measuring the thickness of thin layers which can be applied on test substrates or workpieces 1, 2 simultaneously with the coating of the latter while being conveyed through the process chamber 27, whereby the thickness is measured by acquiring data on the transmission, reflection or resistance properties or by mechanically measuring the thin layer, characterized in that the process chamber 27 is provided with several successive cathode arrangements 7, 8 which have the targets 3, 4 to be sputtered, whereby two diaphragms 39, 40 are held between the respective targets 3, 4 and the workpieces 1, 2 which have, in addition to their center openings 66, 67 for the passage of the flow of coating material, further window-like aperture 68, 69 in the area of the material flow, respectively, which are disposed offset to one another and transversely to the conveying direction F of the substrates and thus produce test strips 70, 71 on the workpieces or special test substrates which are passed by the cathode arrangements 7, 8 and the test strips correspond to one single layer of a layer package 72, respectively, which is produced on the substrate or workpiece 1, 2.

2. Arrangement for measuring the thickness in accordance with claim 1, characterized in that the window-like apertures which are provided on the margin of the diaphragm 39 of the first cathode arrangement 7 are transversely offset by a small degree "a" with respect to the conveying direction F of the substrate as opposed to the window-like aperture 69 of the diaphragm 40 of the following cathode arrangement 8, and the aperture 68 in the diaphragm 39 of the first cathode arrangement 7 is provided directly at the inside edge of the center opening 66 formed by the diaphragm 39.

3. Arrangement for measuring the thickness in accordance with claim 1, characterized in that a multiple of cathode arrangements 7, 8, . . . is provided in one or several successively disposed process chambers 27, . . . , and each cathode arrangement 7, 8 is associated with a diaphragm 39, 40, . . . which has a window-like aperture 68, 69, . . . respectively, and all apertures 68, 69, . . . are disposed offset to one another and transversely to the conveying direction F of the substrates and during the production of the layer package each aperture produces its own test strip 71, 72, . . . either on the workpiece 1, 2, . . . and 1', 2', . . . itself or on an adjacent, separate test substrate.

4. Apparatus for applying a plurality of thin layers one on top of the other on a substrate while simultaneously providing means facilitating the measurement of the thickness of the individual layers, comprising a process chamber wherein said thin layers are applied, means for transporting a substrate through said process chamber along a path in a conveying direction, a like plurality of coating stations in said process chamber, each station comprising cathode means, a target, and a diaphragm having a central opening between the target and the path of the substrate, said openings being arranged successively in said conveying direction, each diaphragm further comprising an aperture, said apertures being offset from one another transversely to the conveying direction, whereby material sputtered from each target forms a respective test strip as the substrate is conveyed past the diaphragms and the thickness of each strip can be independently measured.

5. Process for measuring the thickness of each layer of a plurality of thin layers applied one on top of the other on a substrate, comprising providing a plurality of coating stations, each station comprising cathode means, a target, and a diaphragm having a central opening therein, said openings being arranged successively along a path in a conveying direction, each diaphragm having an aperture, said apertures being offset from one another transversely of the conveying direction, sputtering the targets so that sputtered material passes through the opening and the aperture of each diaphragm, conveying said substrate along said path in said conveying direction so that sputtered material is deposited thereon through said central openings in layers one on top of the other while sputtered material is deposited thereon through said apertures in side-by-side strips, and measuring the thickness of the sputtered material deposited in the side-by-side strips.

* * * * *

UNITED STATES PATENT AND TRADEMARK OFFICE
CERTIFICATE OF CORRECTION

PATENT NO. : 4,981,566
DATED : January 1, 1991
INVENTOR(S) : Hans-Dieter Wurczinger It is certified that error appears in the above-identified patent and that said Letters Patent is hereby corrected as shown below:

Title page,
Insert Reference page attached

ABSTRACT,
Line 8, delete "respectively".

Signed and Sealed this

Eighteenth Day of December, 2001

Attest:

Attesting Officer

JAMES E. ROGAN
*Director of the United States Patent and Trademark Office*